(12) United States Patent
Lin et al.

(10) Patent No.: US 7,013,537 B2
(45) Date of Patent: Mar. 21, 2006

(54) DETENT MEANS FOR A HEAT SINK

(75) Inventors: Jung-Cheng Lin, Taipei Hsien (TW); Hsin-Chang Tsai, Taipei Hsien (TW)

(73) Assignee: Glacialtech, Inc., (TW)

( * ) Notice: Subject to any disclaimer, the term of this patent is extended or adjusted under 35 U.S.C. 154(b) by 54 days.

(21) Appl. No.: 10/875,224

(22) Filed: Jun. 25, 2004

(65) Prior Publication Data
US 2005/0283955 A1    Dec. 29, 2005

(51) Int. Cl.
H05K 7/20    (2006.01)
(52) U.S. Cl. .......................... 24/457; 361/704; 24/458
(58) Field of Classification Search .................. 24/457, 24/458; 165/80.3; 257/718; 174/16.3; 361/704, 361/707, 709, 717, 718, 719
See application file for complete search history.

(56) References Cited

U.S. PATENT DOCUMENTS 5,668,348 A  *  9/1997 Lin ............................... 24/458
5,828,553 A  * 10/1998 Chiou ........................ 361/704
6,684,476 B1 *  2/2004 Yu ............................... 24/458
6,731,504 B1 *  5/2004 Liu ............................. 361/704
6,924,984 B1 *  8/2005 Lee et al. ................... 361/704

* cited by examiner

Primary Examiner—Robert J. Sandy
(74) Attorney, Agent, or Firm—Bacon & Thomas, PLLC

(57) ABSTRACT

The detent means for a heat sink has on each of the two ends of a pressing member a fixing engaging member and a movable engaging member, the movable engaging member is provided thereon with a foldable member. Wherein the pressing member is provided on the heat sink, the fixing engaging member extending downwards to engage protrusions on a side of a fixing seat of a microprocessor, the movable engaging member can be lowered to engage with protrusions on an opposite side of the fixing seat of the microprocessor, and the movable engaging member can be raised to a predetermined level under the action of the foldable member to thereby exert a force on the pressing member, thus the heat sink and the microprocessor at the center of the fixing seat can be press connected with each other.

8 Claims, 5 Drawing Sheets

DETENT MEANS FOR A HEAT SINK

BACKGROUND OF THE INVENTION

1. Field of the Invention

The present invention is related to an improved structure of detent means for a heat sink, and especially is related to such an improved structure being convenient to press connect a heat sink with a microprocessor.

2. Description of the Prior Art

Microprocessors used for personal computers nowadays shall be developed to satisfy the requirement of multifunctional execution of broadband networks as well as multimedia AV playing etc., they have the function of multiplex processing by high time-pulse operation; certainly, under such a tendency, designing of packages for microprocessors themselves shall more note their features of heat sinking, in order to avoid high-speed operation of the microprocessors to make systematical damage or breakdown of machine being due to difficulty of scattering of large heat.

The damage or breakdown is also due to rising of temperature generated by the microprocessors following elevating of the function of operation of the microprocessors; although the microprocessors developed respectively by the two large groups Intel and AMD have different interior chip amounts and different styles of core chips that make the appearances of the microprocessors quite different, as to the basic problem of heat sinking, each microprocessor is still allocated at the center of a fixing seat of a regulated specification; the fixing seat is provided on corresponding sides thereof with a plurality of protrusions for engaging a related detent means, the detent means press connects a heat sink with the microprocessor.

SUMMARY OF THE INVENTION

The detent means for a heat sink of the present invention has on each of the two ends of a pressing member a fixing engaging member extending downwards and a movable engaging member, the movable engaging member is connected with the pressing member via a foldable member, the foldable member is provided on its lower area at least with a pivot portion, and a first pivot axle is extended between the pivot portion and an end of the pressing member, a second pivot axle is extended between a top end of the movable engaging member and the pivot portion; the second pivot axle is kept a fixed distance from the first pivot axle, so that the movable engaging member can swing taking the second pivot axle as an axis, and the movable engaging member can be lowered or raised to a predetermined level under the action of the foldable member.

Thereby, taking advantage of the structural type of the movable engaging member that can swing and lower, the action of detention of the movable engaging member and a plurality of protrusions of a fixing seat can be completed; when the foldable member raises the movable engaging member to a predetermined level, the pressing member can accordingly provide a down pressing action to press tight and connect a heat sink with a microprocessor in the fixing seat, the foldable member can be kept at a position to fix the movable engaging member.

Particularly, during the process that the foldable member raises the movable engaging member to the predetermined level, the distance between the first pivot axle and the second pivot axle is exactly able to generate leverage, the heat sink and the microprocessor can be mutually press connected in a way of saving more force.

The present invention will be apparent in its particular structure and mode of operation after reading the detailed description of the preferred embodiments thereof in reference to the accompanying drawings.

DETAILED DESCRIPTION OF THE PREFERRED EMBODIMENT

Figure 1:
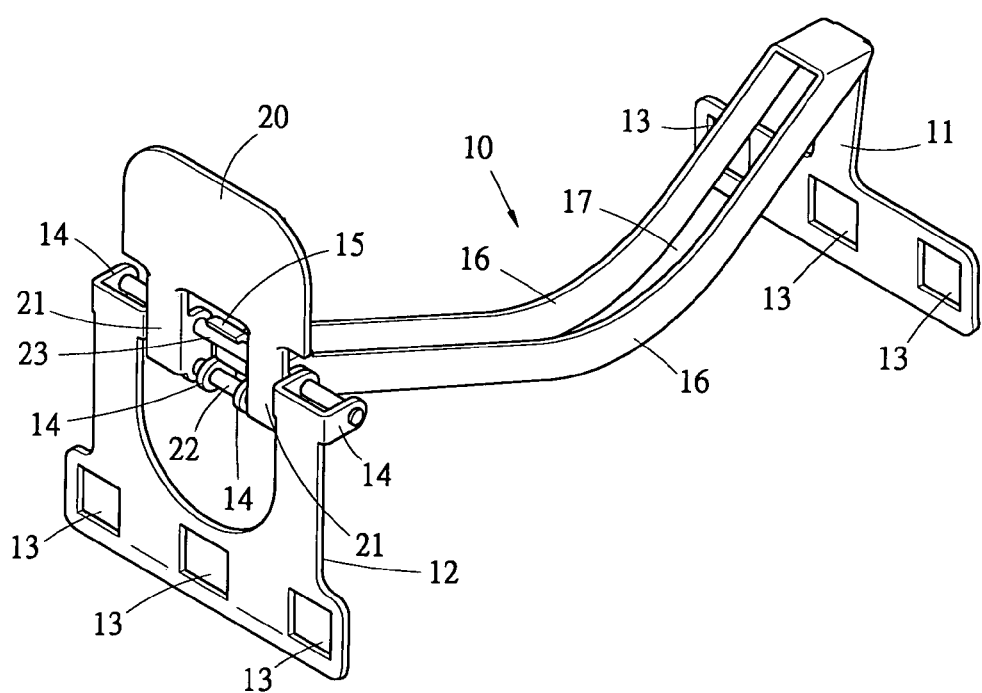
FIG. 1 is a perspective view showing the appearance of a first embodiment of detent means of the present invention.
Figure 2:
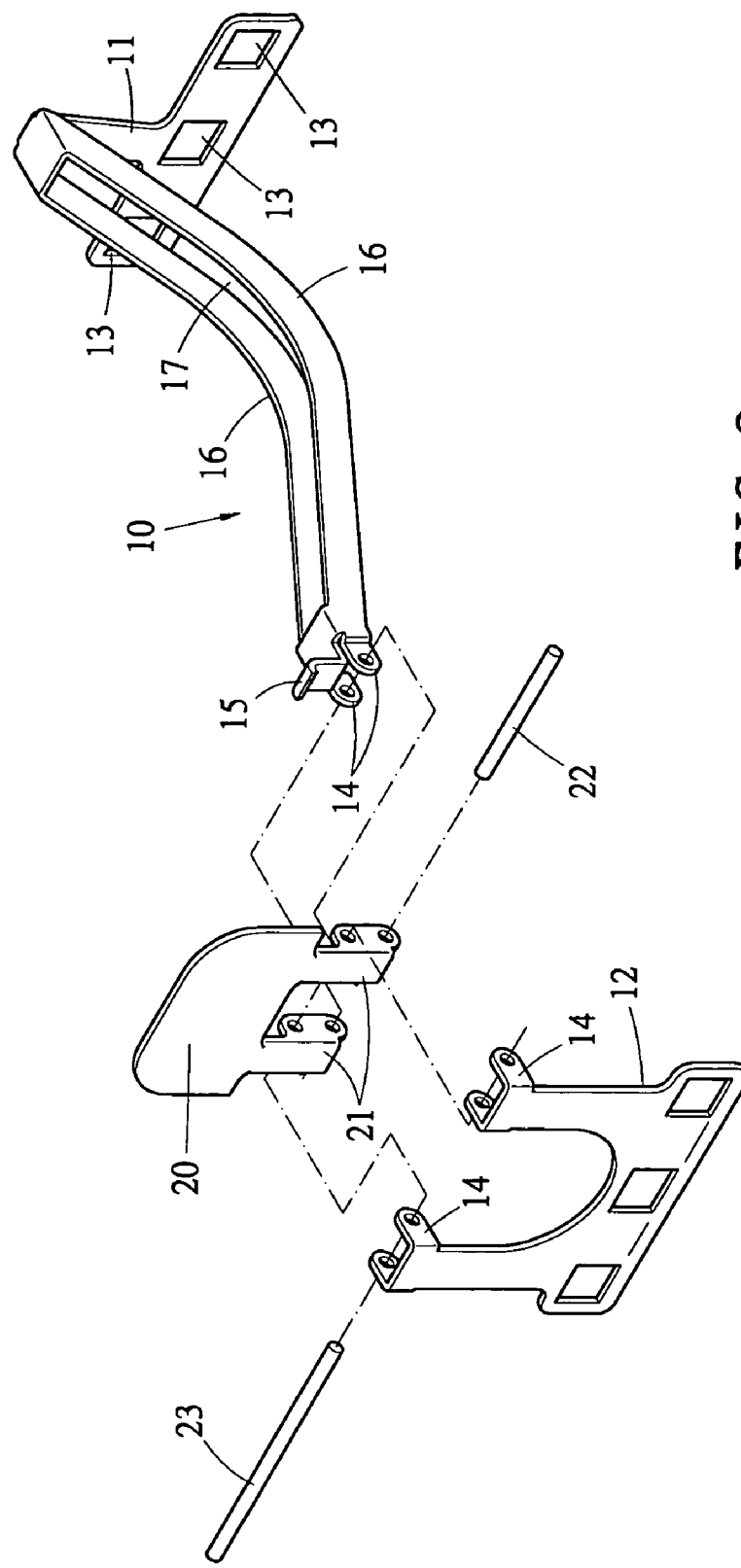
FIG. 2 is a structural analytic perspective view of the first embodiment of detent means of the present invention.
Figure 4:
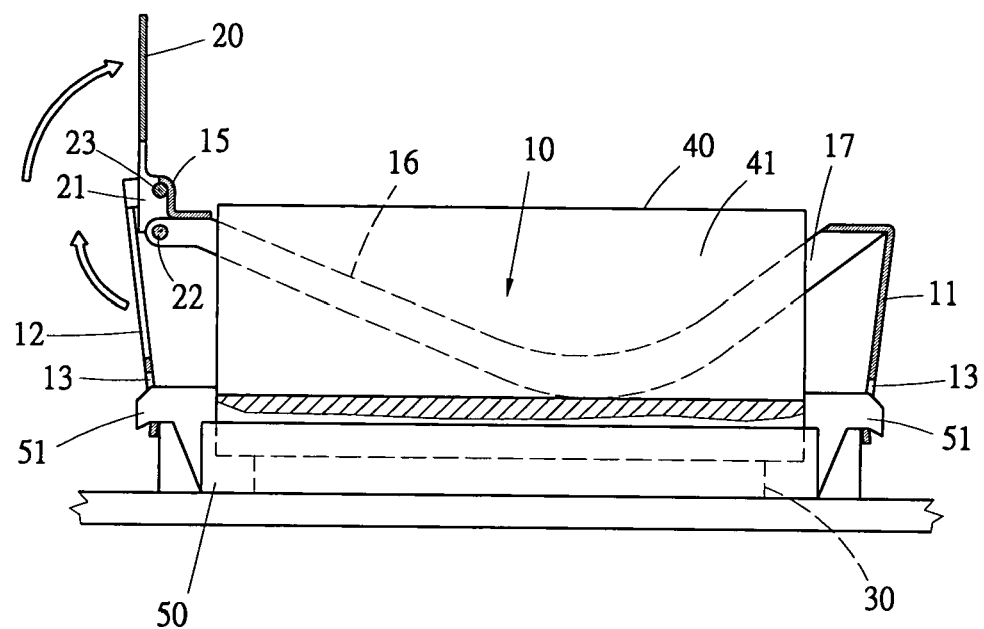
FIG. 4 is a schematic sectional view showing the way of fixing of the movable engaging member of the present invention.

The detent means for a heat sink 40 of the present invention is used, as shown in FIG. 4, to press connect the heat sink 40 with a microprocessor 30 in a fixing seat 50. Referring also to FIGS. 1, 2 and 4, the detent means comprises a pressing member 10, a fixing engaging member 11, a movable engaging member 12 and a foldable member 20, wherein:

The pressing member 10 has two down bending arc shaped sheets 16, the two arc shaped sheets 16 have therebetween an empty area 17 for extending therethrough of a heat sinking fin 14, the lower areas of the arc shaped sheets 16 can press against the heat sink 40.

The fixing engaging member 11 extends down to be fixed on one end of the pressing member 10 to make engagement with a plurality of protrusions 51 on a corresponding side of the fixing seat 50. In the embodiment shown in FIGS. 1 to 4, the fixing engaging member 11 is integrally formed on one end of the pressing member 10, and is provided on a lower area thereof at least with an engaging hole 13 for extending therein of the protrusions 51.

The movable engaging member 12 is connected at the other end opposite to the end of the pressing member 10 provided with the fixing engaging member 11, as shown in FIG. 4, for engaging with a plurality of protrusions 51 on an opposite side of the fixing seat 50, and it is likewise provided on a lower area thereof at least with an engaging hole 13 for extending therein of the protrusions 51.

Figure 3:
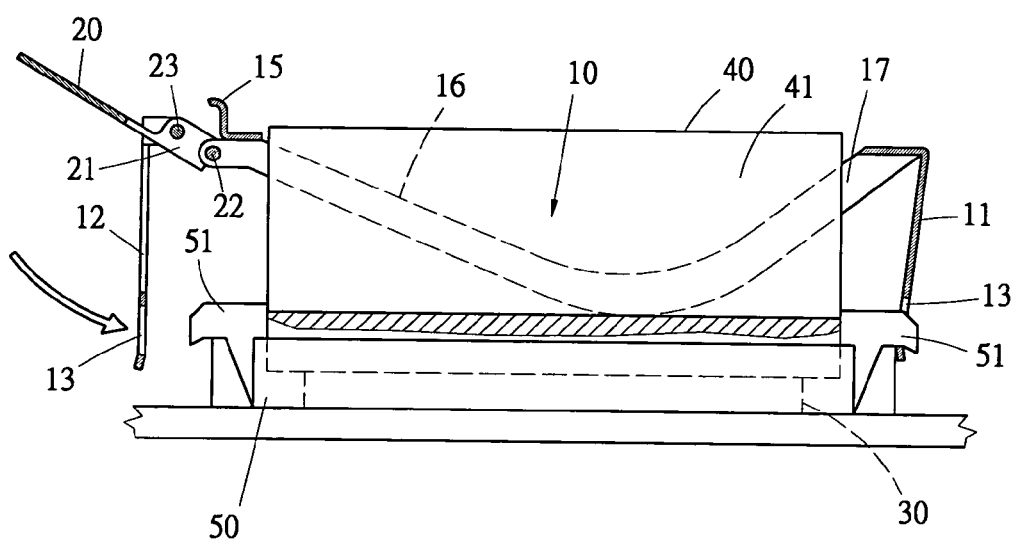
FIG. 3 is a schematic sectional view showing the way of engaging of the movable engaging member with a plurality of protrusions of a fixing seat of the present invention.

The foldable member 20 is used to make connection of the movable engaging member 12 with the pressing member 10, as shown in FIGS. 1 and 3; the foldable member 20 is provided on its lower area at least with a pivot portion 21, and a first pivot axle 22 is extended between the pivot portion 21 and an end of the pressing member 10, a second pivot axle 23 is extended between the top end of the movable engaging member 12 and the pivot portion 21 of the foldable member 20.

In the present embodiment, the pressing member 10 is provided on the end having the movable engaging member 12 with pivot lugs 14 for extending of the first pivot axle 22 therethrough, the movable engaging member 12 is provided on its top end also with pivot lugs 14 for extending of the second pivot axle 23 therethrough. The second pivot axle 23 is kept a fixed distance from the first pivot axle 22, so that the movable engaging member 12 can swing taking the second pivot axle 23 as an axis, and the movable engaging member 12 can be lowered or raised to a predetermined level under the action of the foldable member 20.

And more, the pressing member 10 can further be provided on its end having the movable engaging member 12 with a hooking plate 15 to engage with the second pivot axle 23. Thereby, when in practical using of the entire detent means, such as is shown in FIG. 3, taking advantage of the structural type of the movable engaging member 12 that can swing and lower, the action of detention of the movable engaging member 12 and the protrusions 51 of the fixing seat 50 can be completed; when the foldable member 20 raises the movable engaging member 12 to a predetermined level, such as is shown in FIG. 4, the pressing member 10 can accordingly provide a pressing action to press down the heat sink 40, so that the bottom of the heat sink 40 is press connected with the microprocessor 30 at the center in the fixing seat 50; the foldable member 20 now is under the pressing of the pressing member 10, and the second pivot axle 23 is engaged with the hooking plate 15 and is kept at a position to fix the movable engaging member 12.

Particularly, during the process that the foldable member 20 raises the movable engaging member 12 to the predetermined level, the distance between the first pivot axle 22 and the second pivot axle 23 is exactly able to generate leverage, the heat sink 40 and the microprocessor 30 can be mutually press connected in a way of saving more force.

Figure 5:
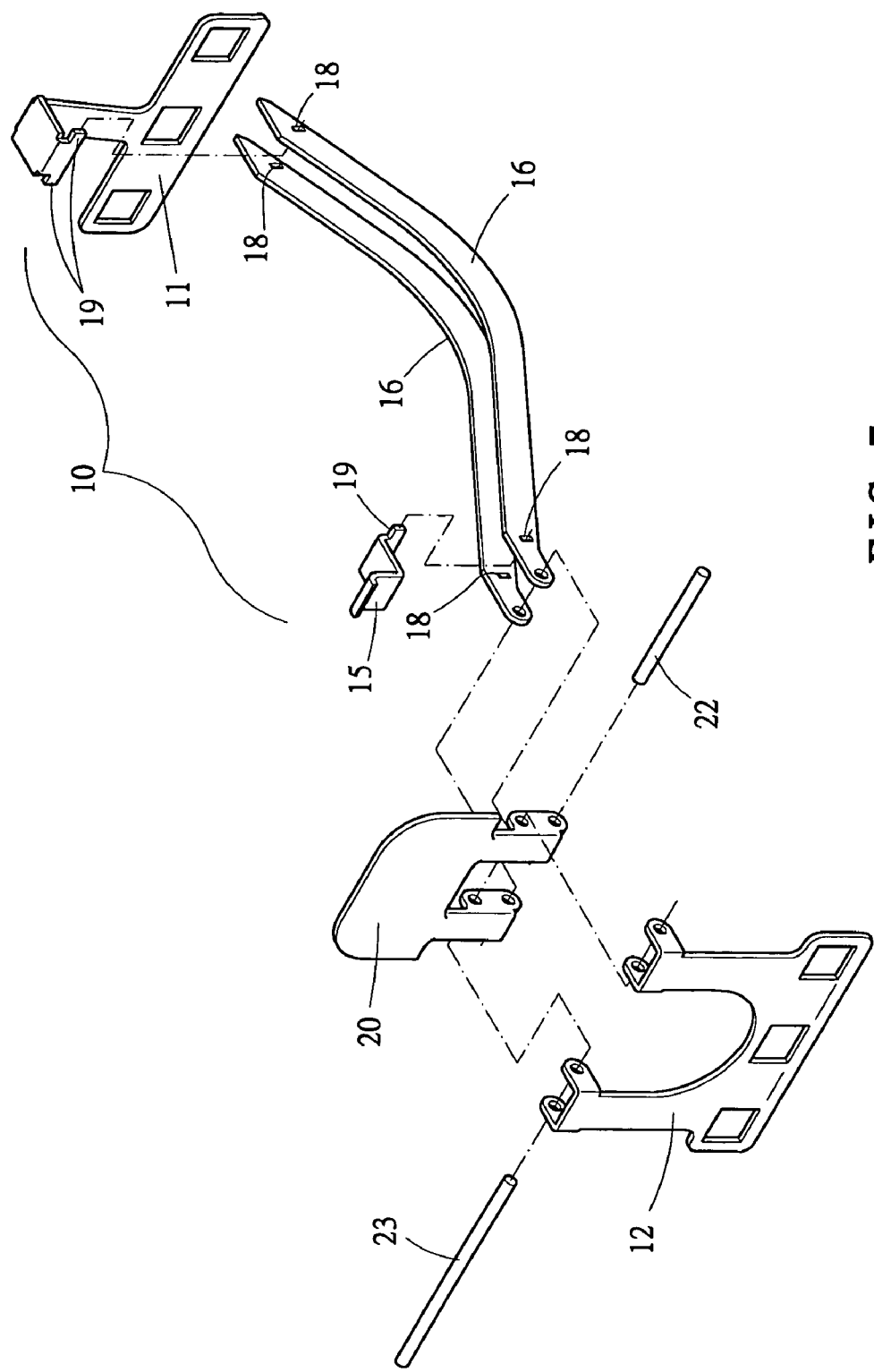
FIG. 5 is a structural analytic perspective view of a second embodiment of detent means of the present invention.

In the embodiment shown in FIGS. 1 to 4, the fixing engaging member 11 of the pressing member 10 and the hooking plate 15 are integrally formed with the two arc shaped sheets 16 and are provided respectively on the two ends of the pressing member 10. Certainly, it can also be the case as shown in FIG. 5 that the fixing engaging member 11, the hooking plate 15 and the arc shaped sheets 16 of the pressing member 10 are respectively designed to be components made individually, wherein connecting areas on the arc shaped sheets 16 for connecting with the fixing engaging member 11 and the hooking plate 15 are provided with rectangular holes 18, the fixing engaging member 11 and the hooking plate 15 are provided correspondingly with rectangular protrusions 19 for inserting into the rectangular holes 18. When in assembling, the two arc shaped sheets 16 are connected to be located at the lateral sides on the top end of the fixing engaging member 11 and the bottom end of the hooking plate 15 respectively, and are fixed at these positions by insertion connecting of the rectangular protrusions 19 with the rectangular holes 18; the ends of the rectangular protrusions 19 extending out of the rectangular holes 18 are riveted to avoid dropping.

Accordingly, the present invention provides the preferred detent means for a heat sink as stated above. The above specification and the drawings are only for illustrating a preferred embodiment of the present invention, and not for giving any limitation to the scope of the present invention. It will be apparent to those skilled in this art that various equivalent modifications or changes without departing from the spirit and characteristic of this invention shall fall within the scope of the appended claims.

What is claimed is:

1. A detent means for a heat sink used to press connect a heat sink with a microprocessor located at the center of a fixing seat, said detent means comprises:

a pressing member, a lower area of said pressing member presses against said heat sink;

a fixing engaging member fixed on one end of said pressing member, and extending down to a side of said fixing seat to make engagement with a plurality of protrusions on said side of said fixing seat;

a movable engaging member connected at an opposite end opposite to said end of said pressing member for engaging with a plurality of protrusions on an opposite side opposite to said side of said fixing seat;

and a foldable member used to make connection of said movable engaging member with said pressing member, said foldable member is provided on its lower area at least with a pivot portion, and a first pivot axle is extended between said pivot portion and said pressing member, a second pivot axle is extended between a top end of said movable engaging member and said pivot portion of said foldable member, said second pivot axle is kept a fixed distance from said first pivot axle, so that said movable engaging member swings taking said second pivot axle as an axis, and said movable engaging member is lowered or raised to a predetermined level under an action of said foldable member.

2. The detent means for a heat sink as in claim 1, wherein:
said pressing member is provided on said opposite end having said movable engaging member with a hooking plate to engage with said second pivot axle.

3. The detent means for a heat sink as in claim 1, wherein:
said pressing member has two down bending arc shaped sheets, said two arc shaped sheets have therebetween an empty area for extending therethrough of a heat sinking fin.

4. The detent means for a heat sink as in claim 1, wherein:
said pressing member is provided on said opposite end having said movable engaging member with pivot lugs for extending of said first pivot axle therethrough.

5. The detent means for a heat sink as in claim 1, wherein:
said movable engaging member is provided on said top end thereof with pivot lugs for extending of said second pivot axle therethrough.

6. The detent means for a heat sink as in claim 1, wherein:
said fixing engaging member and said movable engaging member are formed at least to have an engaging hole each for extending therein of said protrusions.

7. The detent means for a heat sink as in claim 1, wherein:
said pressing member is formed by being connected to have said two arc shaped sheets located respectively at two lateral sides of said fixing engaging member and said hooking plate.

8. The detent means for a heat sink as in claim 7, wherein:
said two arc shaped sheets are provided with rectangular holes at areas for insertion connecting respectively with said fixing engaging member and said hooking plate, said fixing engaging member and said hooking plate are correspondingly provided with rectangular protrusions for inserting into said rectangular holes.

* * * * *